(12) United States Patent
Turner (10) Patent No.: US 7,101,447 B2
(45) Date of Patent: Sep. 5, 2006

(54) TANTALUM SPUTTERING TARGET WITH FINE GRAINS AND UNIFORM TEXTURE AND METHOD OF MANUFACTURE

(75) Inventor: Stephen P. Turner, Moon, PA (US)

(73) Assignee: Honeywell International Inc., Morristown, NJ (US)

( * ) Notice: Subject to any disclaimer, the term of this patent is extended or adjusted under 35 U.S.C. 154(b) by 373 days.

(21) Appl. No.: 09/999,095

(22) Filed: Oct. 30, 2001

(65) Prior Publication Data

US 2002/0125128 A1 Sep. 12, 2002

Related U.S. Application Data

(62) Division of application No. 09/497,079, filed on Feb. 2, 2000, now Pat. No. 6,331,233.

(51) Int. Cl.
C22F 1/18 (2006.01)

(52) U.S. Cl. ....................................... 148/518; 148/668
(58) Field of Classification Search ................. 148/518, 148/668, 422; 29/25.03; 427/79, 80
See application file for complete search history.

(56) References Cited

U.S. PATENT DOCUMENTS

| | | | |
|---|---|---|---|
| 3,268,328 A | 8/1966 | Torti, Jr. | |
| 3,497,402 A | 2/1970 | Douglass | |
| 3,616,282 A | * 10/1971 | Bodway | 205/122 |
| 3,653,981 A | 4/1972 | Watanabe et al. | 148/12.4 |
| 3,849,212 A | 11/1974 | Thornburg | 148/31.55 |
| 4,000,055 A | * 12/1976 | Kumagai | 204/192.15 |
| 4,020,222 A | * 4/1977 | Kausche et al. | 428/209 |
| 4,374,717 A | 2/1983 | Drauglis et al. | |
| 4,466,940 A | 8/1984 | Siewert et al. | |
| 4,517,032 A | 5/1985 | Goto et al. | |
| 4,525,417 A | 6/1985 | Dimigen et al. | |
| 4,619,695 A | 10/1986 | Oikawa et al. | |
| 4,663,120 A | 5/1987 | Parent et al. | |
| 4,762,558 A | 8/1988 | German et al. | |
| 4,842,706 A | 6/1989 | Fukasawa et al. | |
| 4,844,746 A | 7/1989 | Hormann et al. | |
| 4,883,721 A | 11/1989 | Nalepka et al. | |
| 4,889,745 A | 12/1989 | Sata | |
| 4,960,163 A | 10/1990 | Fang et al. | |
| 5,074,907 A | 12/1991 | Amato et al. | |
| 5,087,297 A | 2/1992 | Pouliquen | |
| 5,171,379 A | 12/1992 | Kumar et al. | |
| 5,194,101 A | 3/1993 | Worcester et al. | |
| 5,231,306 A | 7/1993 | Meikle | |
| 5,282,946 A | 2/1994 | Kinoshita et al. | |
| 5,330,701 A | 7/1994 | Shaw et al. | |

(Continued)

FOREIGN PATENT DOCUMENTS

AU 252442 9/1960

(Continued)

OTHER PUBLICATIONS

Hughes et al., "Grain Subdivision and the Development of Local Orientations in Rolled Tantalum" Tantalum. The Minerals, Metals & Materials Society, 1996, pp. 257–262. (Year is sufficiently early so that the month is not an issue.).

(Continued)

*Primary Examiner*—George Wyszomierski
(74) *Attorney, Agent, or Firm*—Wells St. John P.S.

(57) ABSTRACT

A method for producing a tantalum sputtering component includes a minimum of three stages each of which include a deformation step followed by an inert atmosphere high-temperature anneal. Temperatures of each of the anneal steps can be different from one another. A tantalum sputtering component includes a mean grain size of less than about 100 microns and a uniform texture throughout the component thickness. The uniform texture can be predominately {111}<uvw>.

21 Claims, 9 Drawing Sheets

U.S. PATENT DOCUMENTS

| | | | |
|---|---|---|---|
| 5,400,633 A | 3/1995 | Segal et al. | |
| 5,413,650 A | 5/1995 | Jarrett et al. | |
| 5,415,829 A | 5/1995 | Ohhashi et al. | |
| 5,418,071 A | 5/1995 | Satou et al. | |
| 5,456,815 A | 10/1995 | Fukuyo et al. | |
| 5,468,401 A | 11/1995 | Lum et al. | |
| 5,508,000 A | 4/1996 | Satou et al. | |
| 5,513,512 A | 5/1996 | Segal | |
| 5,590,389 A | 12/1996 | Dunlop et al. | |
| 5,600,989 A | 2/1997 | Segal et al. | |
| 5,608,911 A | 3/1997 | Shaw et al. | |
| 5,623,726 A | 4/1997 | Kiiski et al. | |
| 5,673,581 A | 10/1997 | Segal | |
| 5,693,203 A | 12/1997 | Ohhashi | |
| 5,722,165 A | 3/1998 | Kobayashi et al. | 29/894.325 |
| 5,766,380 A | 6/1998 | Lo et al. | 148/577 |
| 5,772,795 A | 6/1998 | Lally et al. | |
| 5,772,860 A | 6/1998 | Sawada et al. | |
| 5,780,755 A | 7/1998 | Dunlop et al. | |
| 5,798,005 A | 8/1998 | Murata | |
| 5,809,393 A | 9/1998 | Dunlop et al. | |
| 5,826,456 A | 10/1998 | Kawazoe et al. | |
| 5,850,755 A | 12/1998 | Segal | |
| 5,993,575 A | 11/1999 | Lo et al. | |
| 5,993,621 A | 11/1999 | Liu | |
| 5,994,181 A * | 11/1999 | Hsieh et al. | 438/239 |
| 6,024,852 A | 2/2000 | Tamura | |
| 6,085,966 A | 7/2000 | Shimomuki | |
| 6,113,761 A | 9/2000 | Kardokus et al. | |
| 6,123,896 A | 9/2000 | Meeks, III et al. | 419/49 |
| 6,130,451 A | 10/2000 | Hasegawa | |
| 6,139,701 A | 10/2000 | Pavate et al. | |
| 6,192,969 B1 | 2/2001 | Bunn et al. | |
| 6,193,821 B1 | 2/2001 | Zhang | |
| 6,221,178 B1 | 4/2001 | Torizuka et al. | |
| 6,348,113 B1 | 2/2002 | Michaluk | |
| 6,348,139 B1 | 2/2002 | Shah et al. | |
| 6,391,163 B1 | 5/2002 | Pavate et al. | |
| 6,454,994 B1 | 9/2002 | Wang | |
| 6,521,173 B1 | 2/2003 | Kumar et al. | |
| 6,887,356 B1 * | 5/2005 | Ford et al. | 204/298.12 |
| 6,896,748 B1 | 5/2005 | Perry et al. | |
| 2001/0023726 A1 | 9/2001 | Koenigamann et al. | |
| 2002/0041819 A1 | 4/2002 | Kumar et al. | |
| 2005/0268999 A1 * | 12/2005 | Oda | 148/668 |

FOREIGN PATENT DOCUMENTS

| | | |
|---|---|---|
| DE | 284905 A5 | 11/1990 |
| EP | 0281141 B2 | 3/1988 |
| EP | 0 590 904 | 4/1994 |
| EP | 0902102 A1 | 8/1998 |
| EP | 822 813 | 12/1998 |
| EP | 0902102 A1 * | 3/1999 |
| JP | 55-179784 | 12/1980 |
| JP | 59227992 A | 12/1984 |
| JP | 62-089543 | 4/1987 |
| JP | 362089543 | 4/1987 |
| JP | 62-297463 | 12/1987 |
| JP | 03-082773 | 4/1991 |
| JP | H03-197640 A | 8/1991 |
| JP | HO3-197640 | 8/1991 |
| JP | 6-10107 | 6/1992 |
| JP | 6-93400 | 9/1992 |
| JP | 6-256919 | 3/1993 |
| JP | 6-264232 | 9/1994 |
| JP | 08-136406 | 5/1996 |
| JP | 08146201 A | 6/1996 |
| JP | 8-232061 | 9/1996 |
| JP | 8-269701 | 10/1996 |
| JP | 10008244 A | 1/1998 |
| WO | WO 87/07650 | 12/1987 |
| WO | WO 92/01080 | 1/1992 |
| WO | WO 9902743 | 1/1999 |
| WO | WO 9927150 | 6/1999 |
| WO | WO 99/66100 | 12/1999 |
| WO | WO 00/31310 | 6/2000 |
| WO | WO 0129279 | 4/2001 |

OTHER PUBLICATIONS

Arlt, Jr., "Sulfonation and Sulfonation to Thorium and Thorium Compounds" Kirk–Othmer Encyclopedia of chemical Technology vol. 22, pp. 541–564, (1993, Year is sufficiently early so that the month is not an issue).

Kirkbride et al., "The Effect of Yitrium on the Recrystallization and Grain Growth of Tantalum", J. Loss–Common Metals, vol. 9, pp. 393–408, 1965. (Year is sufficiently early so that the month is not an issue.).

National Research Corporation Press Release, pp. 1–4, Jul. 1964.

National Research Corporation Data Sheet "SGS Tatalum", pp. 1–7, no date.

ASTM Standard Specification for Tantalum and Tantalum Alloy Plate, Sheet, and Strip, pp. 558–561, 1992. (Year is sufficiently early so that the month is not an issue.).

Kumar, et al. "Effect of Intermetallic Compounds of the Properties of Tantalum" Materials Research Society Symposium Proceedings, vol. 322, pp. 413–422, 1994. (Year is sufficiently early so that the month is not an issue.).

Kumar, et al. "Effect of Intermetallic Compounds of the Properties of Tantalum"Refractory Metals & Hard Materials, vol. 12, pp. 35–40, 1994. (Year is sufficiently early so that the month is not an issue.).

Klein et al., "Inhomogeneous Textures in Tantalum Sheets" Materials Science Forum, vol. 157–162, pp. 1432, (1994).(Year is sufficiently early so that the month is not an issue.).

S. Sawada, "On Advanced Sputtering Targets of Refractory Metals and Their Silicides for VLSI–Applications", $12^{th}$ International Plansee Seminar, 1989, Top 5: Ultrapure Refractory Metals, pp. 201–222.

Clark et al., "Influence of Transverse Rolling on the Microstructural and Texture Development in Pure Tantalum", Metallurgical Transactions, vol. 23A, pp. 2183–2191, Aug. 1992.

Raabo, et al., "Texture and Microstructure of Rolled and Annealed Tantalum", Materials Science and Technology, vol. 10, pp. 299–305, Apr. 1994.

Wright et al., "Texture Gradient Effects in Tantalum", International Conference on Textures of Materials, 7 pgs., Sep. 1993.

P. Ding et al, "Copper Barrier, Seed Layer, and Planarization Technologies", Jun. 10–12, 1997 VMIC Conference 1997, ISMIC–107/97/0087(c), pp. 87–92.

Wright et al., "Textural and Microstructural Gradient Effects on the Mechanical Behavior of a Tantalum Plate", Metallurgical Transactions A, 25A(1994), pp. 1–17. (Year is sufficiently early so that the month is not an issue.).

Clark et al., "Effect of Processing Variables on Texture and Texture Gradients in Tantalum", Metallurgical Transactions A, vol. 22A, Sep. 1991, pp. 2039–2047).

Kumar et al., "Corrosion Resistant Properties of Tantalum" Corrosion 95, Paper No. 253, 14 pages. (No date).

Segal, Materials Processing by SimpleShear, Materials Science and Engineering, A197 (1995) pp. 157–164.

Thomas Ruglic, Normalizing of Steel, ASM Handbook, vol. 4, Heat Treating, Copyright 1991, pp. 35–41.

Friedman, "Grain Size Refinement in a Tantalum Lagot", Metallurgical Transactions, vol. 2 No. 1, Jan. 1971, pp. 337–341.

Clark et al, "Influence of initial lagot Breakdown on the Microstructural and Textural Development of High Purity Tantalum", Metallurgical transactions, vol. 22A, pp. 2959–2968, Dec. 1991.

Koch et al, Tantalum–Processing, Properties and Applications, JOM vol. 41., No. 10, Oct. 1989, pp. 33–39.

"Aluminum and Aluminum Alloys," ASM Specialty Handbook, ASM International, 1993, pp. 290–292.

BPAI Patent Interference No. 105, 158 Judgment, Turner v. Michaluk, May 19, 2004.

V. M. Segal et al., "Processes of Plastic Structure Formation", Science and Engineering, 1994, published in Russia, Chapters 1, 3 and 4, with Statement in Accordance with 37 CFR 1.98(a)(3)(i).

Mukai, T. et al, "Dynamic Mechanical Properties of a Near–Nano Aluminum Alloy Processed by Equal–Channel–Angular–Extrusion", Nano–Structured Materials, vol. 10, No. 5, pp. 755–765 (1998) Elsevier Science Ltd, no month data.

Hatch, J.E., *Aluminum*, 1984, Chap. 5, "Metallurgy of Heat Treatment and General Principles of Precipitation Hardening", pp. 134–157, 175–183, no month data.

Ferrasse, S. et al., "Development of a Submicrometer-Grained Microstructure in Aluminum 6061 Using Equal Channel Angular Extrusion", J. Mater. Res. vol. 12, No. 5, May 1997, pp. 1253–1261.

Ferrasse, et al, "Microstructure and Properties of Copper and Aluminum Alloy 3003 Heavily Worked by Equal Channel Angular Extrusion", Metallurgical and Materials Transactions, A: Physical Metallurgy & Materials Science, the Minerals, Metals and Materials Society, vol. 28A, No. 4, Apr. 1997, pp. 1047–1057.

V. Pavate, et al., "Correlation between Aluminum alloy sputtering target metallurgical characteristics, Are initiation, and In–film defect density," SPIE vol. 3214, 1997, pp. 42–47, no month data.

Cabot Performance Materials, "Material Evaluation Report", Mar. 25, 1998, Ingot No. T891C.

Domenic A. Canonico, "Stress–Relief Heat Treating of Steel", ASM Handbook, vol. 4, 1991, no month data.

ASM Handbook, vol. 4, 1991, "Heat Treating of Aluminum Alloys", pp. 841–879, no month data.

Klein, C. et al., "Manual of Mineralogy", John Wiley & Sons, Inc. 1985, pp. 39–40, no month data.

Wright, S. et al., "Effect of Annealing Temperature on the Texture of Rolled Tantalum and Tantalum–10 Wt.% Tungsten", Proceedings of the 2nd Internatl. Conf. on Tungsten and Refractory Metals, 1994, pp. 501–508, no month data.

Wenk, Hans–Rudolf, "Preferred Orientation in Deformed Metals and Rocks: An Introduction to Modern Texture Analysis", Academic Press 1985, pp. 8–10, no month data.

Cullity, B., "Elements of X–Ray Diffraction, Second Edition", Addison–Wesley Pub. Co., Inc., pp. 294–297, no date.

U.S. Patent No. 09/098,760, Shah (as filed and amended), filed Jun. 17, 1998.

Anonymous, *Solid Lubricants, Industrial Lubrication and Tribology*, Nov./Dec. 1995, vol. 47, iss. 6, p. 7–18.

R.Z. Valiev et al., "Bulk Nanostructured materials from severe plastic deformation", Progress in Materials Science, vol. 45, 2000, pp. 103–189.

S. Ferrasse et al., "ECAE Targets with Sub–Micron Grain Structures Improve Sputtering Performance and Cost–o-f–Ownership", Semiconductor Manufacturing, vol. 4, Issue 10, Oct. 2003, pp. 76–92.

Yoshinori Iwahashi et al., "Microstructural Characteristics of Ultrafine–Grained Aluminum Produced Using Equal-Channel Angular Pressing", Metallurgical and Materials Transactions, vol. 29A, pp. 2245–2252, Sep. 1998.

M. Furukawa et al., "Microhardness Measurements and the Hall–Petch Relationship in an Al–Mg Alloy with Submicrometer Grain Size", Acta Mater. vol. 44, No. 11, pp. 4619–4629, 1996.

Segal et al., "Plastic Working of Metals by Simple Shear", Russian Metall. vol. 1, pp. 99–105, 1991.

Rusian Z. Valiev et al., "SPD–Processed Ultra–Fine Grained Ti Materials for Medical Applications", Advanced Materials & Processes, Dec. 2003, pp. 33–34.

F. J. Humphreys et al., "Developing stable fine–grain microstructures by large strain deformation", Phil. Trans. R. Soc. Lond. A, Jun. 15, 1999, vol. 357 #1756, pp. 1663–1681.

S. Ferrasse et al., "Texture evolution during equal channel angular extrusion Part I. Effect of route, number of passes and initial texture", Materials Science and Engineering, vol. 368, Mar. 15, 2004, pp. 28–40.

V.M. Segal, "Equal channel angular extrusion: from macromechanics to structure formation", Materials Science & Engineering A271, Nov. 1, 1999, pp. 322–333.

R.Z. Valiev et al., "Plastic deformation of alloys with submicron–grained structure", Materials Science and Engineering, A137 (1991) pp. 35–40.

AMS Specialty Handbook, *Aluminum and Aluminum Alloys*, ASM International, 1993, pp 290–292.

Metals Handbook 8$^{th}$ Edition, vol. 1, *Properties and Selection of Metals*, American Society for Metals, 1961, pp. 15 and 18.

"*Nickel, Cobalt, and Their Alloys*", ASM International, Dec. 2000, pp. 76, 230–234.

"*Aluminum and Aluminum Alloys*", ASM International, 1993, p. 639.

Michaluk et al. "Methodologies for Determining the Global Texture of Tantalum Plate using X–ray Diffraction"Tantalum, The Minerals, Metal & Materials Society, 1996, pp. 123–131.

* cited by examiner

TANTALUM SPUTTERING TARGET WITH FINE GRAINS AND UNIFORM TEXTURE AND METHOD OF MANUFACTURE

RELATED PATENT DATA

This application resulted from a divisional application of U.S. patent application Ser. No. 09/497,079, filed on Feb. 2, 2000 now U.S. Pat. No. 6,331,233.

FIELD OF THE INVENTION

This invention relates to the processing of high-purity tantalum to produce a sputtering target with a microstructure that is desirable for uniform sputtering. In particular, the invention relates to the manufacture of high-purity tantalum with a mean grain size of less than 100 μm and a uniform, predominately (111)<uvw> crystallographic texture throughout the target thickness.

BACKGROUND OF THE INVENTION

Tantalum is currently used extensively in the electronics industry, which employs tantalum in the manufacture of highly effective electronic capacitors. Its use is mainly attributed to the strong and stable dielectric properties of the oxide film on the anodized metal. Both wrought thin foils and powders are used to manufacture bulk capacitors. In addition, thin film capacitors for microcircuit applications are formed by anodization of tantalum films, which are normally produced by sputtering. Tantalum is also sputtered in an Ar—$N_2$ ambient to form an ultra thin TaN layer which is used as a diffusion barrier between a Cu layer and a silicon substrate in new generation chips to ensure that the cross section of the interconnects can make use of the high conductivity properties of Cu. It is reported that the microstructure and stoichiometry of the TaN film are, unlike TiN, relatively insensitive to the deposition conditions. Therefore, TaN is considered a much better diffusion barrier than TiN for chip manufacture using copper as metallization material. For these thin film applications in the microelectronics industry, high-purity tantalum sputtering targets are needed.

Figure 1:
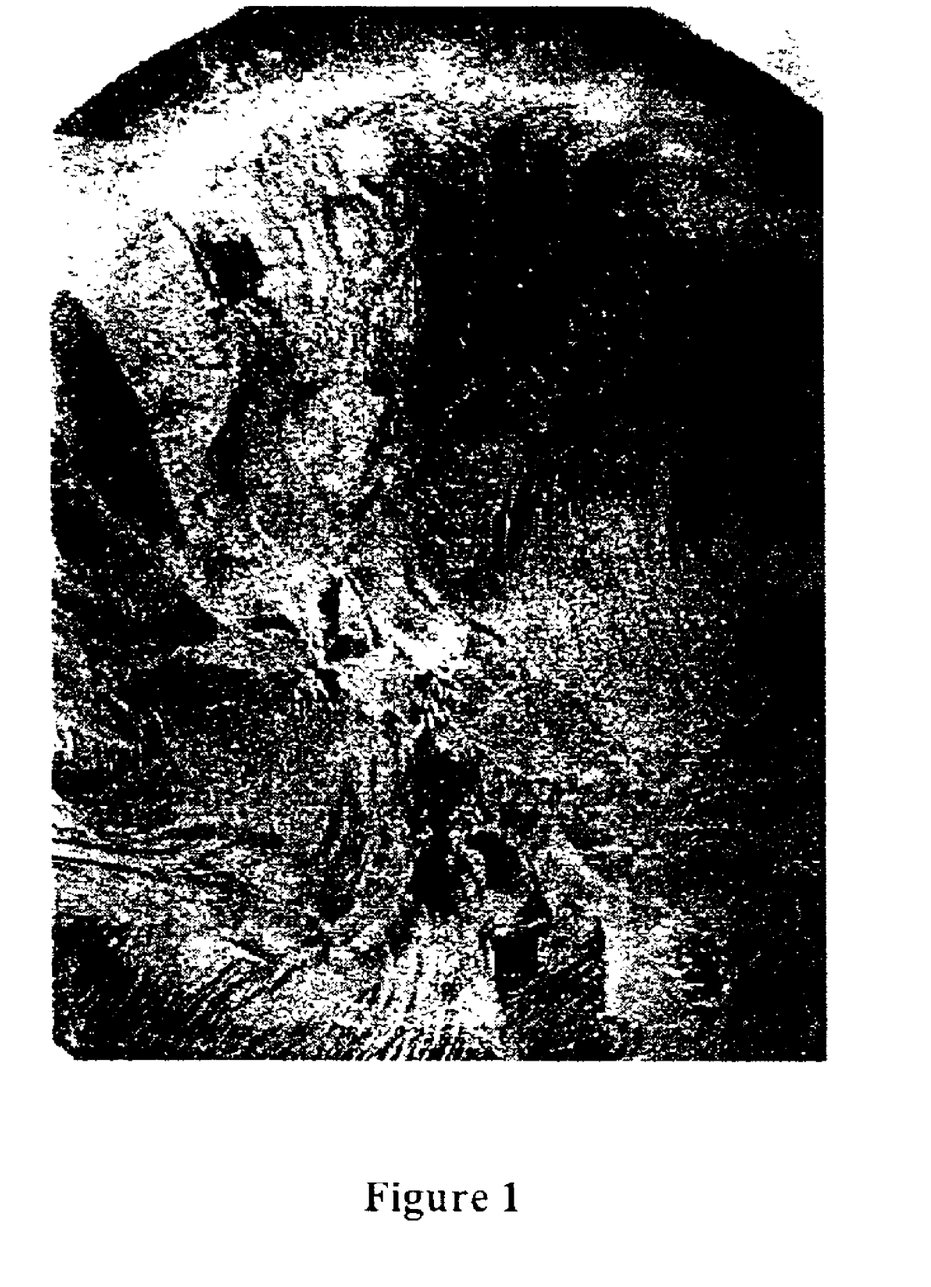
FIG. 1 is a photograph of a used high purity tantalum sputtering target with a non-uniform texture throughout the target thickness.

The typical tantalum target manufacturing process includes electron-beam (EB) melting ingot, forging/rolling ingot into billet, surface machining billet, cutting billet into pieces, forging and rolling the pieces into blanks, annealing blanks, final finishing and bonding to backing plates. The texture in tantalum plate is very dependent on processing mechanisms and temperatures. According to Clark et al. in the publication entitled "Effect of Processing Variables on Texture and Texture Gradients in Tantalum" (*Metallurgical Transactions A*, September 1991), the texture expected to develop in cold-rolled and annealed bcc metals and alloys consists of orientations centered about the ideal orientations, {001}<110>, {112}<110>, {111}<110>, and {111}<112>. Generally conventionally processed tantalum is forged or rolled from ingot to final thickness, with only one (1) or no intermediate annealing stages. A final anneal is usually applied to the plate simply to recrystallize the material. The direction of the deformation influences the strengths of resulting annealed textures but generally little attention is given to the resulting distribution of textures. In conventionally processed tantalum, significant texture variation exists in the cross-section of the plate, as described by Clark et al. (August 1992), Raabe et al. (1994), Michaluk (1996). Typically the above mentioned textures exist in stratified bands through the thickness of the rolled plate, or form a gradient of one texture on the surface usually {100}<uvw>, with a gradual transition to a different texture at the centerline of the plate, usually {111}<uvw>, Wright et al. (1994). Another cause of texture variation through the target thickness is the non-uniformity of the deformation processes used to form the plate. Texture non-uniformity results in variable sputter deposition rates and sputter surface irregularities, which in turn is believed to be a source of micro-arcing. Micro-arcing is believed to believed to be the principle cause of particle generation and is thus undesirable in the semiconductor industry. FIG. 1 shows the sputter surface of a mixed-texture tantalum target made by conventional processing methods. The sputter surface reveals regions of two different crystallographic textures; dark areas are {100}<uvw>, lighter areas {111}<uvw>. The type of pattern illustrated in FIG. 1 is believed to contribute to sputter film nonuniformities because of the different sputter rates associated with each texture.

Figure 2:
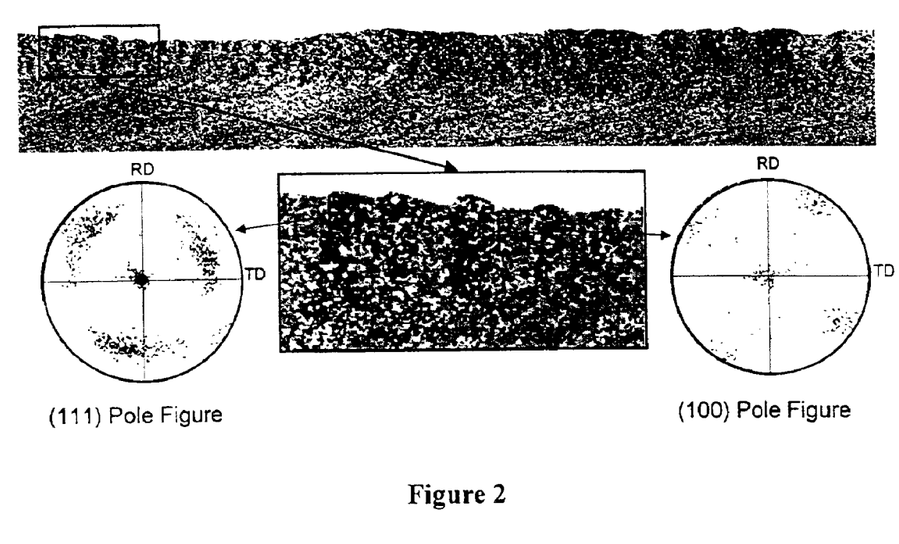
FIG. 2 is a cross-sectional EBSD image of a conventionally processed, severely banded sputtered tantalum target.

FIG. 2 shows severe textural banding in the cross-section of a sputtered tantalum target manufactured according to conventional processes. 'Textural banding', refers to a localized concentration of one texture in the cross section strung out over several grains in a matrix of another texture. In tantalum, it is typically {100}<uvw> textures in a matrix of the more prominent {111}<uvw> textures. For example, a series of grains with the same {100}<uvw> texture in a matrix of {111}<uvw> are aligned in an elongated manner over several grains is considered a banded textural feature. Using Electron Backscatter Diffraction, EBSD, imaging the texture in small, localized areas can be determined accurately.

In FIG. 2, it can be clearly seen that areas of {100}<uvw> type textures sputter at a greater rate than {111}<uvw> type textures. Thus, any textural non-uniformity at the target surface will produce surface 'ridges', which have an increased likelihood of causing micro-arcing.

SUMMARY OF THE INVENTION

In accordance with the present invention there is provided a processing route for producing high purity tantalum sputtering targets with a mean fine grain size of less than 100 microns and uniform crystallographic texture throughout the target thickness.

The method comprises forging, rolling and annealing high-purity, vacuum-melted tantalum ingots in such a way as to eliminate remnant as-cast grain structure, and produce a homogeneous fine-grain size (mean <100 μm) microstructure with a uniform, predominately {111}<uvw> texture throughout the thickness of the target. Significant sputtering problems have been reported when the texture of the target is not uniform throughout the target thickness. Sputtering rates and film deposition rates change as a function of target crystallographic texture. This variable sputter rate across a target surface causes film thickness uniformity problems and also produces unwanted surface topography in the form of 'ridging', which in turn is believed to cause micro-arcing.

This invention uses a series of deformation techniques, with a minimum of three (3) intermediate, high-temperature inert-atmosphere anneals, preferably vacuum, to produce a combination of fine-grain size (mean <100 μm) tantalum targets with a uniform, predominately {111}<uvw> texture throughout the target thickness, until now unseen in the industry today. 'Uniform texture throughout the target thickness' refers to a homogeneous distribution of textural components with no visible banding at a resolution of 20× from the target surface to at least mid-thickness. 'Inert' refers to an atmosphere that is non-reactive with the tantalum-comprising mass.

Experiments associated with this invention also revealed that by controlling the annealing temperature the most desirable texture for collimated sputtering, the (111) texture, can be generated. The (111) texture is the only texture that has one of the close-packed directions aligned normal to the target surface. This direction is a dominant emission direction and is, therefore, the texture required for collimated sputtering.

The high-purity tantalum material of the present invention is preferably 3N5 (99.95%) pure and comprises less than 500 ppm total metallic impurities, excluding gases. The methods of chemical analysis used to derive the chemical descriptions set forth herein are the methods known as glow discharge mass spectroscopy (GDMS) for metallic elements and LECO gas analyzer for non metallic elements.

For the purposes of this invention, the term "sputtering target" covers not only sputtering targets in the traditional sense, but also any other component within the sputtering chamber that is likely to sputter.

DETAILED DESCRIPTION

Figure 3:
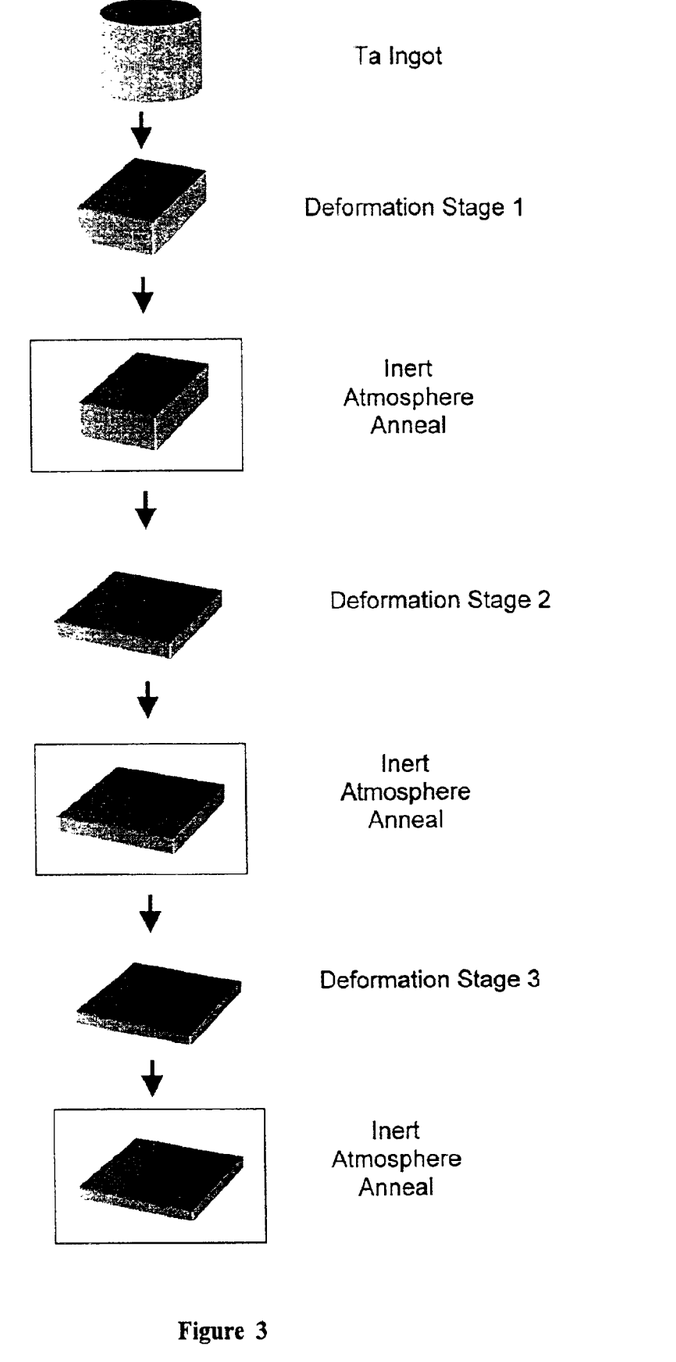
FIG. 3 is a schematic of the process of the present invention.
Figure 4:
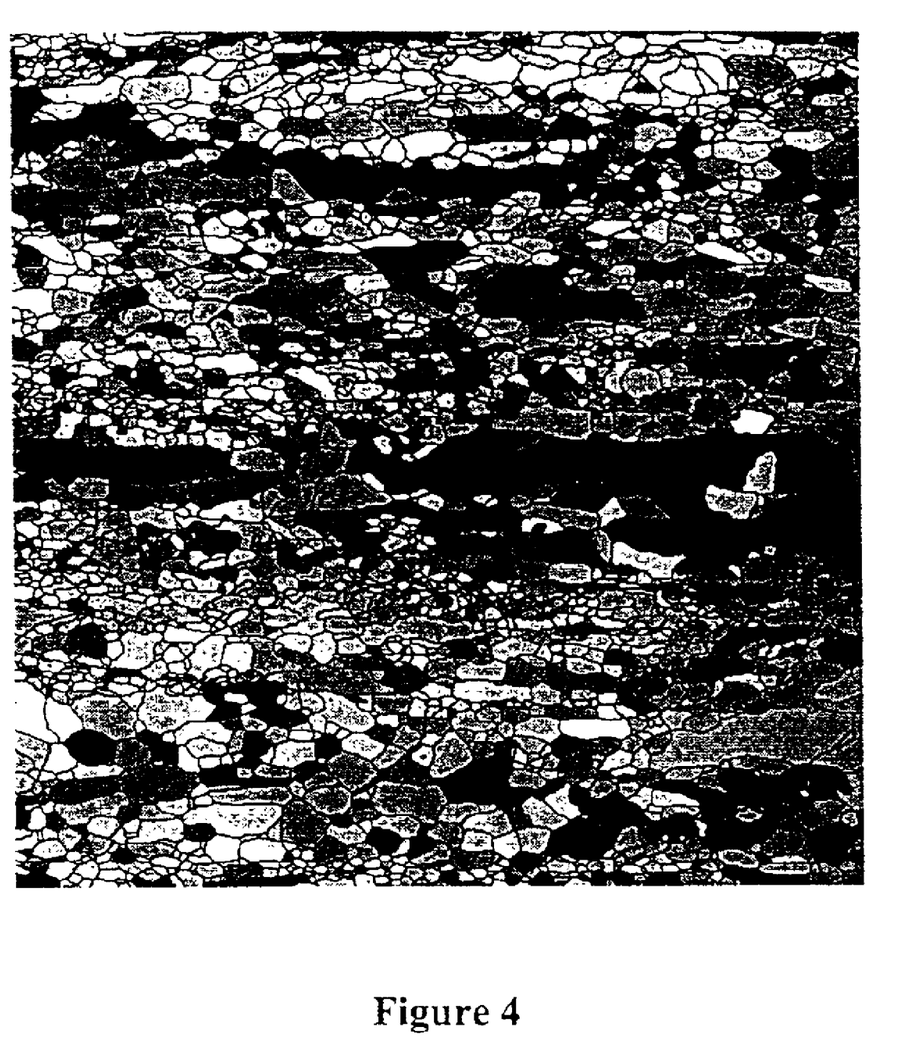
FIG. 4 is a cross-sectional EBSD image of a conventionally processed (Process 2), severely banded high-purity tantalum sputter target.
Figure 5:
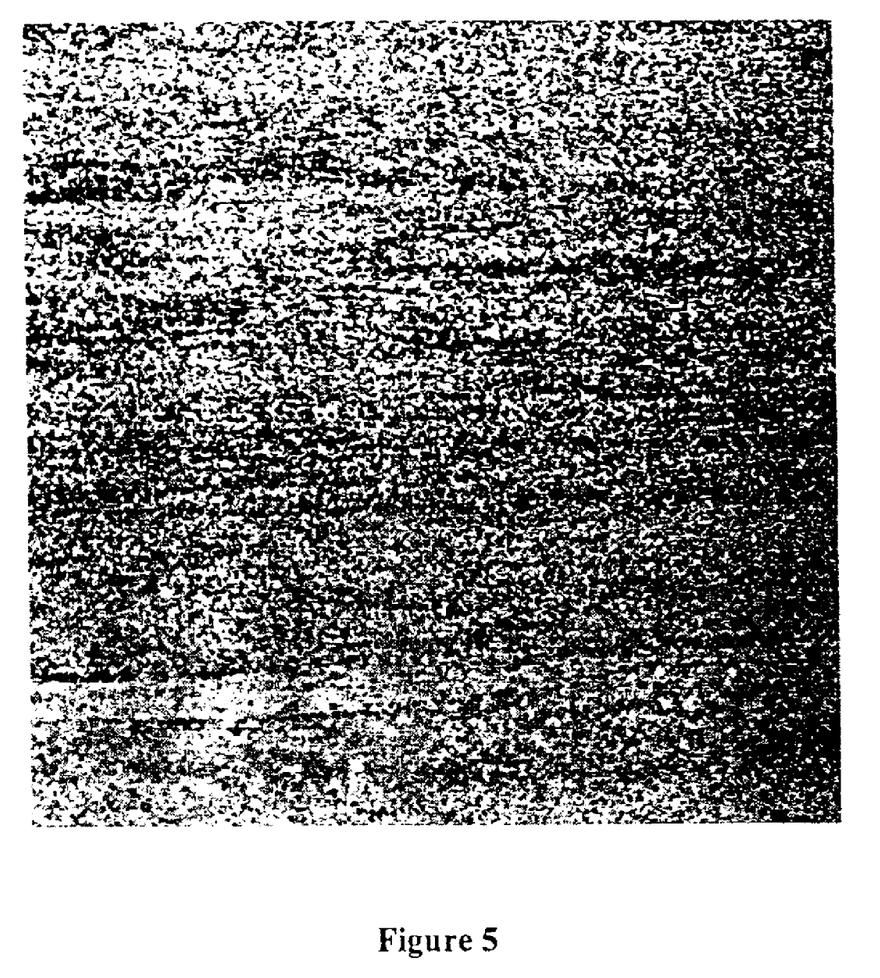
FIG. 5 is a cross-sectional EBSD image of a conventionally processed (Process 3), high-purity tantalum sputtering target.
Figure 6:
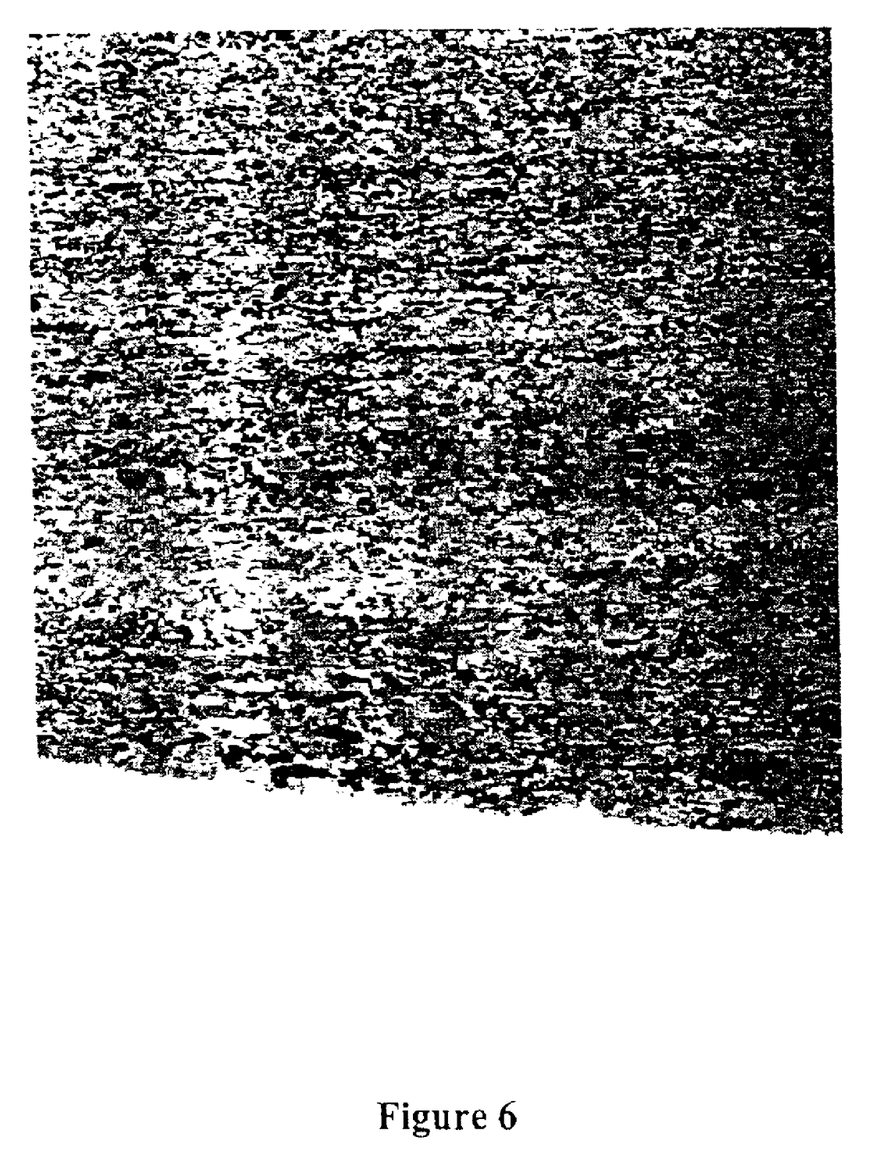
FIG. 6 is a cross-sectional EBSD image of a high-purity tantalum sputter target manufactured by Process 4.
Figure 7:
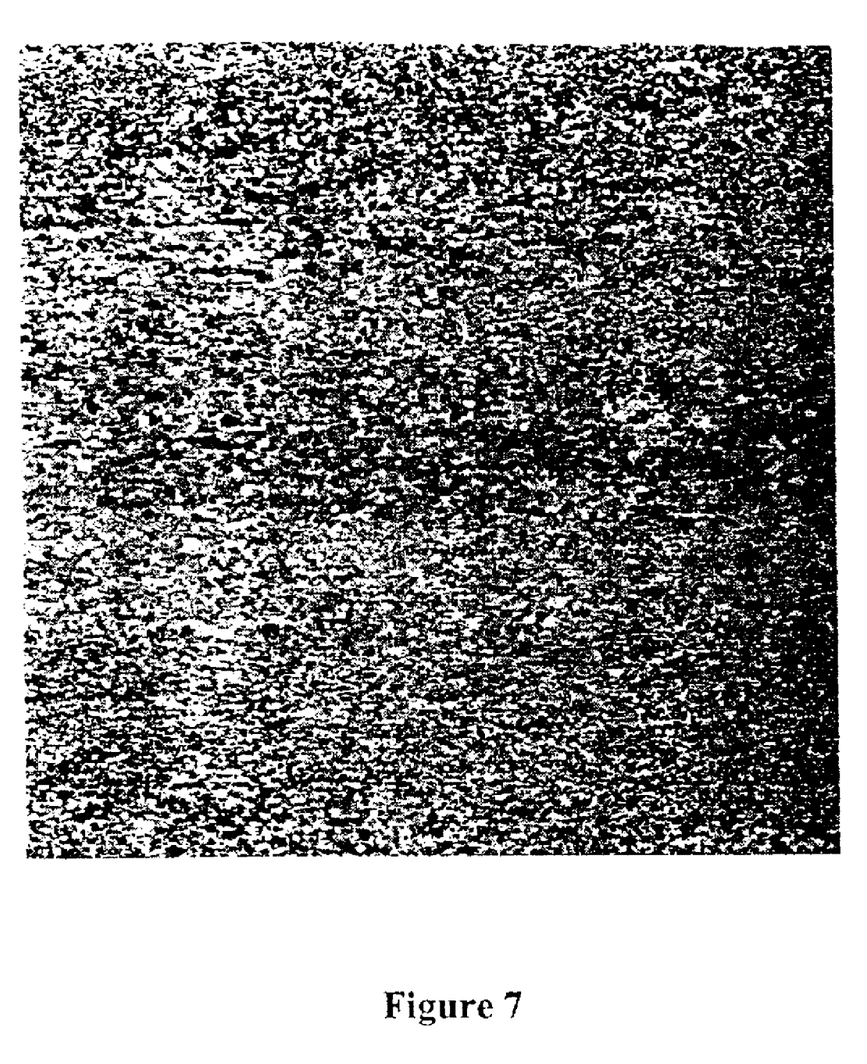
FIG. 7 is a cross-sectional EBSD image of a high-purity tantalum sputter target manufactured by Process 7.

Electron beam (EB), Vacuum Arc Melted (VAR) or other vacuum melted tantalum ingots are deformed perpendicular to the ingot centerline to break up the as-cast grain microstructure. This deformation can be forging, rolling or extrusion whereby significant cross-sectional area or thickness reduction takes place. The reduction in cross-sectional area should be greater than a reduction ratio of 3:1 (cross-sectional area of ingot to cross-sectional area of the forged billet), or equivalent to no less than about 40% strain reduction from starting thickness to final thickness. The forged billet should then be annealed in an inert atmosphere, preferably vacuum, at a high temperature (1500 F.–2800 F.), preferably between 2200 F. and 2400 F., in order to achieve a recrystallized microstructure. The resulting billet/plate is then deformed no less than an additional 35%, preferably 45–65%, of its thickness and subjected to a second high-temperature inert atmosphere anneal between 1500 F. and 2800 F., preferably between 2200 F. and 2400 F. The process of the present invention comprises an additional deformation step with a strain >60% followed by a final inert-atmosphere anneal (1500 F.–2800 F.) to recrystallize the microstructure to the desired fine grain size. FIG. 3 is a schematic of the invented process. The deformation directions to achieving the desired results. The process of this invention preferably utilizes no less than three deformation steps and no less than three inert-atmosphere anneal steps from ingot to final target plate thickness in order to achieve the desired results. Three or more deformation and intermediate inert-atmosphere, high-temperature annealing stages are more likely to eliminate grain size and textural banding while maintaining a mean grain size of less than 100 microns than would less than 3 deformation and annealing stages.

EXAMPLE 1

Twelve high-purity tantalum ingots were processed according to conventional methods or the process of this invention. The parameters for each experiment and the corresponding grain size and texture results are summarized in Table 1. Texture uniformity was measured by cutting samples from the target and analyzing them using an EBSD system on a scanning electron microscope (SEM). The mapped area was 7 mm×7 mm and was measured from the target surface to at least the plate mid-thickness. The lighter areas depict {111}<uvw> textures and the darker areas depict {100}<uvw> textures.

Figure 8:
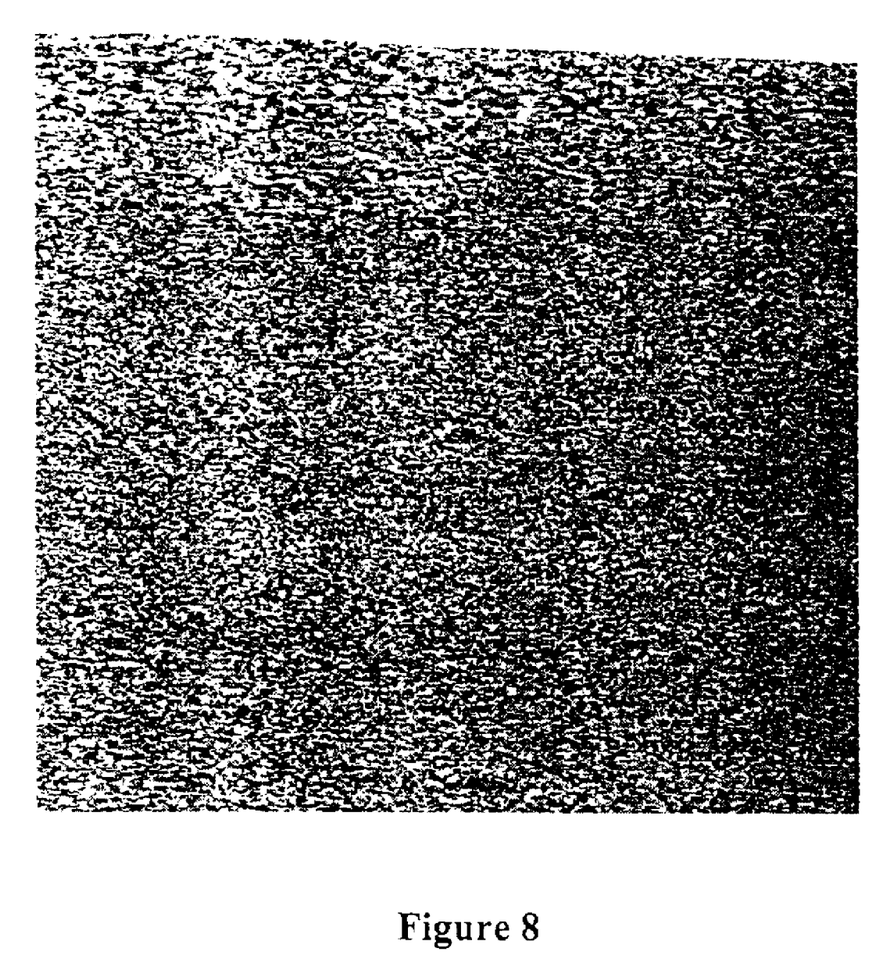
FIG. 8 is a cross-sectional EBSD image of a high-purity tantalum sputter target manufactured by the process of the present invention (Process 12).

The ingots processed by conventional methods (Processes 1 through 7) exhibited a banded microstructure in both grain size and texture. FIGS. 4, 5, 6 and 7 illustrate the extent of this banding. The ingots manufactured by the invented process (Processes 8 through 12) have a strong {111}<uvw> textures with a random distribution of {100}<uvw> textures. FIG. 8, which represents product of the present invention, shows a high degree of textural uniformity throughout the target cross-section, with no banding.

Although the experimental data shows the grain size results to be less than about 50 µm it is expected that a grain size of less than 100 µm will produce similar sputtering results, so long as the texture is uniform throughout the target thickness.

TABLE 1

|  | Process 1 Conven | Process 2 Conven | Process 3 Conven | Process 4 Conven | Process 5 Conven | Process 6 Conven |
|---|---|---|---|---|---|---|
| Ingot Melting Process | VAR | E-Beam | E-Beam | E-Beam | E-Beam | E-Beam |
| Purity | 4N | 4N | 3N5 | 3N5 | 4N | 3N8 |
| Ingot break-up (Stage 1 deformation) | None | None | >40% | >40% | None | >40% |

TABLE 1-continued

| | | | | | | |
|---|---|---|---|---|---|---|
| High-temperature, inert-atmosphere anneal? | No | No | No | Yes | No | Yes |
| Stage 2 deformation | >40% | >40% | >40% | >40% | >40% | >40% |
| High-temperature, inert-atmosphere anneal? | Yes | Yes | Yes | Yes | Yes | No |
| Stage 3 deformation | — | — | — | — | >60% | >60% |
| High-temperature, inert-atmosphere anneal? | — | — | — | — | Yes | Yes |
| Number of anneals | 1 | 1 | 1 | 2 | 2 | 2 |
| Mean grain size (μm) | Banded 50–250 μm | Heavy Banding 100–250 μm | 35 μm | 55 μm | Banded 50–200 μm | 30 μm |
| Texture Description | Mixed (111) & (100), banded | Mixed (111) & (100), banded | Mixed (111) & (100), banded | (111) with banded (100) | Mixed (111) & (100), banded | Mixed (111) & (100), Extreme banded |
| Texture uniformity through thickness | Very Poor | Very Poor | Poor | Poor | Poor | Very Poor |

| | Process 7 Conven | Process 8 Invention | Process 9 Invention | Process 10 Invention | Process 11 Invention | Process 12 Invention |
|---|---|---|---|---|---|---|
| Ingot Melting Process | E-Beam | E-Beam | E-Beam | E-Beam | E-Beam | E-Beam |
| Purity | 3N8 | 3N8 | 3N8 | 4N | 3N8 | 3N8 |
| Ingot break-up (Stage 1 deformation) | >40% | >40% | >40% | >40% | >40% | >40% |
| High-temperature, inert-atmosphere anneal? | Yes | Yes | Yes | Yes | Yes | Yes |
| Stage 2 deformation | >40% | >40% | >40% | >40% | >40% | >40% |
| High-temperature, inert-atmosphere anneal? | No | Yes | Yes | Yes | Yes | Yes |
| Stage 3 deformation | >60% | >60% | >60% | >60% | >60% | >60% |
| High-temperature, inert-atmosphere anneal? | Yes | Yes | Yes | Yes | Yes | Yes |
| Number of anneals | 2 | 3 | 3 | 3 | 3 | 3 |
| Mean grain size (μm) | 37 μm | 35 μm | 51 μm | 45 μm | 39 μm | 22 μm |
| Texture Description | (100) at surface and (111) at centerline | Strong (111) with random distribution of (100) | Strong (111) with random distribution of (100) | Strong (111) with random distribution of (100) | Strong (111) with random distribution of (100) | Strong (111) with random distribution of (100) |
| Texture uniformity through thickness | Poor | Good | Excellent | Excellent | Excellent | Excellent |

EXAMPLE 2

Figure 9:
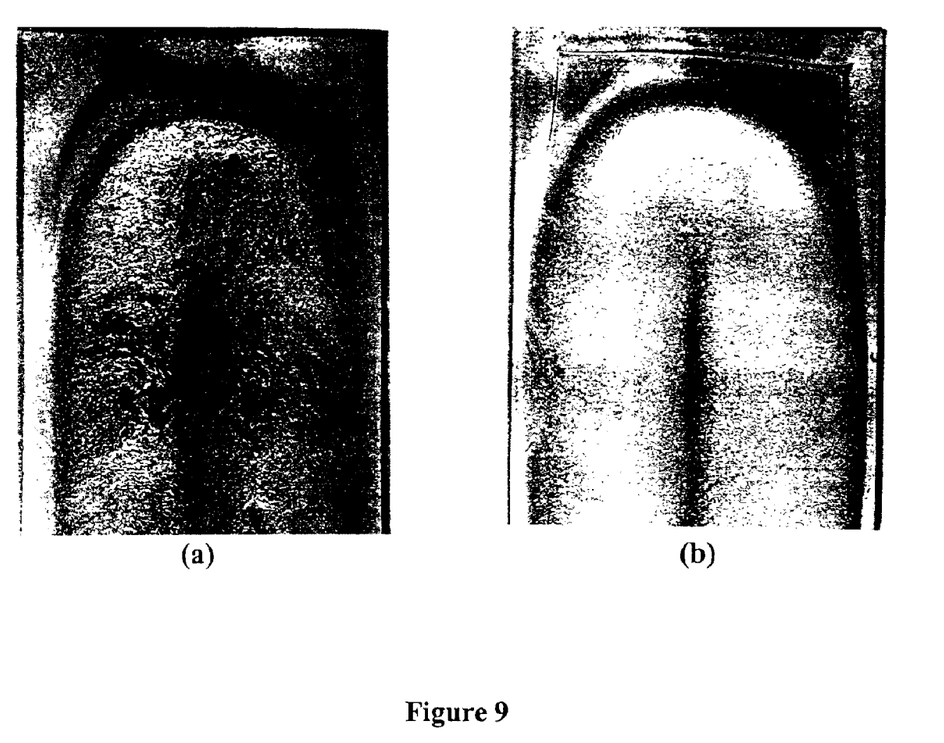
FIG. 9(a) is a photograph of the experimental sputtering targets manufactured by the conventional method (Process 4).
FIG. 9(b) is a photograph of an experimental sputtering target manufactured by the process of the present invention (Process 12).

Sputter trials were conducted on a conventional high-purity tantalum target and a target processed according to this invention in order to compare the sputtering characteristics. FIG. 9(a) and FIG. 9(b) are photographs of the used conventional and invented targets, respectively. The conventional target exhibits extensive surface roughness which is associated with non-uniform sputtering. This surface 'ridging' in turn increases the likelihood of micro-arcing and sputter film non-uniformity. In contrast, the target processed according to this invention exhibits a smooth evenly-sputtered surface.

What is claimed is:

1. A method for producing a tantalum sputtering component comprising a minimum of three stages each of which comprise a deformation step followed by an inert atmosphere high-temperature anneal, the anneal occurring at a temperature of from 2200° F. to 2800° F. in at least the first two of the minimum of three stages and the tantalum sputtering component exhibiting a mean grain size of less than about 100 microns and a uniform texture that is predominately {111}<uvw> throughout a thickness of the component.

2. A method for producing a tantalum sputtering component, comprising:
   providing an initial tantalum-comprising mass;
   first deforming the initial tantalum-comprising mass to form a first deformed mass, the first deforming comprising reducing a thickness of the mass;
   annealing the first deformed mass at a first temperature of at least about 1500° F. to about 2800° F.;
   second deforming the tantalum-comprising mass to form a second deformed mass, the second deforming comprising reducing a thickness of the first deformed mass;
   annealing the second deformed mass at a second temperature of at least about 1500° F.;
   third deforming the second deformed tantalum-comprising mass to form a third deformed mass, the third deforming comprising reducing a thickness of the second deformed mass; and
   annealing the third deformed mass at a third temperature of at least about 1500° F., the first, second and third temperatures being different from one another and the sputtering component exhibiting a uniform texture that is predominately {111}<uvw> throughout a thickness of the component.

3. The method of claim 2 wherein the first deforming comprises reducing the thickness of the mass by at least about 40%.

4. The method of claim 2 wherein the second deforming comprises reducing the thickness of the first deformed mass by at least about 35%.

5. The method of claim 2 wherein the third deforming comprises reducing a thickness of the second deformed mass by at least about 60%.

6. The method of claim 2 wherein the initial tantalum-comprising mass is in the form of an ingot and wherein the third deformed mass has a thickness corresponding to a plate thickness of the tantalum sputtering target formed from the ingot.

7. A method of claim 2 wherein said deformation of said tantalum ingot is carried out by forging, rolling or extrusion.

8. The method of claim 2 wherein the sputtering component comprises a mean grain size of less than about 100 microns.

9. The method of claim 2 wherein at least one of the annealing the first, second, and third deformed masses comprises vacuum annealing.

10. A method for producing a tantalum sputtering component, comprising:
provisioning a tantalum-comprising mass having a first thickness;
reducing the thickness of the tantalum-comprising mass from the first thickness to a second thickness; and after reducing the thickness of the tantalum-comprising mass to the second thickness, first annealing the mass at a first temperature of at least about 2200° F. to 2400° F.;
reducing the thickness of the tantalum-comprising mass from the second thickness to a third thickness; and after reducing the thickness of the tantalum-comprising mass to the third thickness, second annealing the mass at a second temperature of from 2200° F. to 2400° F.; and
reducing the thickness of the tantalum-comprising mass from the third thickness to a fourth thickness; and after reducing the thickness of the tantalum-comprising mass to the fourth thickness, third annealing the mass at a third temperature of at least about 1500° F., the tantalum sputtering component exhibiting a mean grain size of less than about 100 microns and uniform texture that is predominately {111}<uvw> throughout a thickness of the component.

11. The method of claim 10 wherein the mass is exposed to a first ambient during the first annealing, is exposed to a second ambient during the second annealing, and is exposed to a third ambient during the third annealing; the first, second and third ambients consisting of components which are inert relative to reaction with the tantalum-comprising mass.

12. The method of claim 10 wherein at least one of the first, second, and third annealing comprises vacuum annealing.

13. A method for producing a tantalum sputtering target comprising a minimum of three stages that each include a deformation step followed by an inert atmosphere high-temperature anneal, the high-temperature anneal occurring at different temperatures of from about 2200° F. to about 2800° F. in at least the first two of the minimum of three stages and the tantalum sputtering component exhibiting a uniform texture that is predominately {111}<uvw> throughout a thickness of the component.

14. The method of claim 13 wherein the high-temperature anneal occurs at a temperature of about 2200° F. to 2400° F. in at least the first two of the minimum of three stages.

15. A method of producing a tantalum sputtering target comprising the steps of:
(a) providing an initial tantalum-comprising mass;
(b) first deforming said initial tantalum-comprising mass to form a first deformed mass, said first deforming comprising reducing a thickness of said mass;
(c) annealing said first deformed mass at first temperature of from about 2200° F. to about 2400° F.;

(d) second deforming the tantalum-comprising mass to form a second deformed mass, said second deforming comprising reducing a thickness of said first deformed mass;
(e) annealing said second deformed mass at a second temperature of a least about 2200° F.;
(f) third deforming the second deformed tantalum-comprising mass to form a third deformed mass, said third deforming comprising reducing a thickness of the second deformed mass; and
(g) annealing the third deformed mass at a third temperature of at least about 1500°F., the first, second and third temperatures being significantly different from one another.

16. The method of claim 15 wherein the temperature of said first and second stage anneal is from about 2200° F. to 2400° F.

17. A process of forming a thin film tantalum-containing capacitor comprising the steps of:
(a) producing a tantalum sputtering target using a minimum of three stages that each include a deformation step followed by an inert atmosphere of high-temperature anneal, the high temperature anneal occurring at a temperature of from about 2200° F. to about 2800° F. in at least the first two of the minimum of three stages, the tantalum sputtering target exhibiting a mean grain size of less than 100 microns and a uniform texture that is predominately {111}<uvw> throughout a thickness of the component;
(a) sputtering said produced tantalum sputtering target to form a thin film; and
(b) anodizing said sputtered thin film to form a said thin film tantalum-containing capacitor.

18. A capacitor forming method comprising:
producing a tantalum sputtering component using a minimum of three stages that include a deformation step followed by an inert atmosphere high-temperature anneal, the high-temperature anneal occurring at a temperature of from 2200° F. to 2400° F. in at least the first two of the minimum of three stages, the tantalum sputtering component exhibiting a mean grain size of less than about 100 microns and a uniform texture that is predominately {111}<uvw> throughout a thickness of the component;
forming a first capacitor electrode;
sputtering the tantalum sputtering component to form a tantalum layer over the capacitor electrode;
anodizing the sputtered tantalum to form a capacitor dielectric; and
forming a second capacitor electrode over the capacitor dielectric.

19. The method of claim 18 wherein the high-temperature anneal occurs at a temperature of at least about 1500° F. in a stage subsequent to the first two of the minimum of three stages.

20. The method of claim 18 wherein the inert atmosphere anneal comprises a vacuum anneal.

21. A capacitor forming comprising:
forming a tantalum sputtering component comprising a mean grain size of less than about 50 microns and a uniform texture that is predominately {111}<uvw> throughout a thickness of the component, the forming using a minimum of three stages that each include a deformation step followed by an inert atmosphere high-temperature anneal, the high temperature anneal at a temperature of from 2200° F. to 2400° F. in at least the first two of the minimum of three stages;

forming a first capacitor electrode;

collimated sputtering of the tantalum sputtering component to form a tantalum layer over the capacitor electrode;

forming sputtering dielectric form the sputtered tantalum; and forming a second capacitor electrode over the capacitor dielectric.

* * * * *